(12) United States Patent
Agarwal et al.

(10) Patent No.: US 10,998,904 B1
(45) Date of Patent: May 4, 2021

(54) PROGRAMMABLE TERMINATION CIRCUITS FOR PROGRAMMABLE DEVICES

(71) Applicant: Xilinx, Inc., San Jose, CA (US)

(72) Inventors: Sundeep Ram Gopal Agarwal, Hyderabad (IN); Brian C. Gaide, Eire, CO (US); Ramakrishna Kishore Tanikella, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/686,073

(22) Filed: Nov. 15, 2019

(51) Int. Cl.
*H03K 19/00* (2006.01)
*H01L 25/065* (2006.01)

(52) U.S. Cl.
CPC ..... *H03K 19/0005* (2013.01); *H01L 25/0657* (2013.01); *H01L 2225/06541* (2013.01)

(58) Field of Classification Search
CPC ............ H03K 19/0005; H01L 25/0657; H01L 2225/06541
See application file for complete search history.

(56) References Cited

U.S. PATENT DOCUMENTS

| 5,134,311 A | * | 7/1992 | Biber | H03K 19/0005 326/30 |
| 2005/0102646 A1 | * | 5/2005 | Madurawe | H03K 19/177 326/38 |
| 2007/0279084 A1 | * | 12/2007 | Oh | G11C 16/26 326/30 |
| 2013/0002291 A1 | * | 1/2013 | Park | G11C 7/1057 326/30 |

* cited by examiner

*Primary Examiner* — Daniel D Chang
(74) *Attorney, Agent, or Firm* — Paradice and Li LLP

(57) ABSTRACT

Configurable termination circuits for use with programmable logic devices are disclosed. In one implementation, the termination circuit may include one or more components to couple unused inputs of one or more configurable logic blocks to a fixed voltage. In another implementation, the termination circuit may include one or more components to couple unused inputs of one or more configurable logic blocks to an output of the one or more configurable logic blocks. In some implementations, the programmable logic device may include a platform management controller to configure the termination circuits based on configuration data.

16 Claims, 9 Drawing Sheets

PROGRAMMABLE TERMINATION CIRCUITS FOR PROGRAMMABLE DEVICES

TECHNICAL FIELD

This disclosure relates generally to programmable devices, and specifically to programmable termination circuits for programmable devices.

BACKGROUND

Programmable logic devices (PLDs) are devices that may be programmed by a user to implement a variety of user-specified circuit designs. One example of a PLD is a field programmable gate array (FPGA). An FPGA may include an array of configurable logic blocks (CLBs), dedicated random access memory blocks (BRAM), input/output blocks (IOBs), digital signal processors (DSPs), a plurality of programmable interconnect elements (INTs), a number of processing cores, and other subsystems (such as memory controllers, device management resources, and configuration circuitry) that may be selectively connected together by programmable interconnect structures. A user-specified circuit design may be implemented within a programmable device by loading configuration data representative of the user-specified circuit design into configuration registers that collectively determine the functions and operations performed by the various blocks, interconnect structures, and subsystems of the programmable device.

The density of programmable logic designs may be increased by vertically stacking two or more PLDs on top of one another. For example, two or more PLD dies may be bonded or attached to each other, and die-to-die interconnects (such as through-silicon vias (TSVs), metal bumps, or microballs) may provide electrical and signals connections between the vertically stacked PLD dies. When multiple PLDs are vertically stacked, some inputs of one or more of the stacked PLDs may not be connected to other PLDs. These unconnected inputs, which may be referred to as "floating inputs," may cause associated logic circuits to have (or to remain in) an indeterminate state, and may be susceptible to damage from electro-static discharge (ESD). In addition, these unconnected inputs may be "unreachable" during device testing.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter. The systems, methods and devices of this disclosure each have several innovative aspects, no single one of which is solely responsible for the desirable attributes disclosed herein.

One innovative aspect of the subject matter disclosed herein can be implemented in a device. In some implementations, the device may include a plurality of logic circuits, a plurality of termination circuits, and a memory. Each of the plurality of logic circuits may include one or more input terminals and an output terminal, and each of the termination circuits may be configured to selectively couple an input terminal of a corresponding logic circuit to a respective one of a plurality of non-floating terminals based on a control signal. The memory may store configuration data indicative of the control signals provided to the termination circuits. In some aspects, each of the non-floating terminals may be one of a supply voltage, ground potential, or the output terminal of another logic circuit. In some implementations, each of the logic circuits may be one of a configurable logic block (CLB), a block random access memory (BRAM), or a programmable interconnect element (INT) of a programmable logic device (PLD).

Each termination circuit may be configured to couple the corresponding logic circuit input terminal to a voltage or ground potential when the corresponding logic circuit input terminal is unused or unconnected, and may be configured to isolate the corresponding logic circuit input terminal from the voltage or ground potential when the corresponding logic circuit input terminal is connected to another logic circuit. In addition, or in the alternative, each termination circuit may be configured to couple the corresponding logic circuit input terminal to the output terminal of another logic circuit when the corresponding logic circuit input terminal is unused or unconnected.

In some implementations, the device may be a first die of a plurality of dice arranged in an active-on-active die assembly. In some aspects, the first die may be a top die of the plurality of dice arranged in the active-on-active die assembly. In other aspects, the first die may be a bottom die of the plurality of dice arranged in the active-on-active die assembly. In one or more implementations, the plurality of termination circuits may be configured to route test signals between each die of the plurality of dice arranged in the active-on-active die assembly.

Another innovative aspect of the subject matter disclosed herein can be implemented in a stacked active-on-active die assembly. The stacked active-on-active die assembly may include at least a first device and a second device coupled to each other. The first device may include a plurality of first logic circuits, and the second device may include a plurality of second logic circuits and a plurality of termination circuits. Each of the first logic circuits may include one or more input terminals and an output terminal, and each of the second logic circuits may include one or more input terminals and an output terminal. In some implementations, each of the termination circuits may be configured to selectively couple the input terminal of a corresponding second logic circuits to a respective one of a plurality of non-floating terminals based on configuration data. In some aspects, each of the non-floating terminals may be one of a supply voltage, ground potential, or the output terminal of another logic circuit. In some implementations, each of the logic circuits may be one of a configurable logic block (CLB), a block random access memory (BRAM), or a programmable interconnect element (INT) of a programmable logic device (PLD).

The configuration data may cause the termination circuits to couple unused or unconnected input terminals of the second logic circuits to a voltage or ground potential, and may cause the termination circuits to isolate connected input terminals of each of the second logic circuits from the voltage or ground potential. In addition, or in the alternative, the configuration data may cause the termination circuits to couple unused or unconnected input terminals of each of the second logic circuits to the output terminal of another one of the second logic circuits.

In some implementations, the second device is bonded to an outer surface of the first device and electrically coupled to the first device using a plurality of through-silicon vias. In some aspects, the plurality of termination circuits may be configured to route test signals between each of the first device, the second device, and one or more other devices stacked in the stacked active-on-active die assembly.

Another innovative aspect of the subject matter disclosed herein can be implemented as a method. The method may be used to configure a device, and may include determining whether an input terminal of a respective one of a plurality of logic circuits is unused or is connected to another logic circuit, coupling the input terminal to a supply voltage or ground potential based on a determination that the input terminal is unused, and isolating the input terminal from the supply voltage or ground potential based on a determination that the input terminal is connected to another logic circuit. In some implementations, the input terminal may be coupled to the supply voltage or ground potential by enabling a corresponding one of the plurality of termination circuits based on a control signal, and the input terminal may be isolated from the supply voltage or ground potential by disabling the corresponding one of the plurality of termination circuits based on the control signal. In some implementations, each of the logic circuits may be one of a configurable logic block (CLB), a block random access memory (BRAM), or a programmable interconnect element (INT) of a programmable logic device (PLD).

BRIEF DESCRIPTION OF THE DRAWINGS

The example implementations are illustrated by way of example and are not intended to be limited by the figures of the accompanying drawings. Like numbers reference like elements throughout the drawings and specification. Note that the relative dimensions of the following figures may not be drawn to scale.

DETAILED DESCRIPTION

Implementations of the subject matter described herein may be used to control the unconnected or unused inputs of one or more of a plurality of vertically-stacked devices arranged in an active-on-active die assembly. In some implementations, the unconnected or unused input terminals of a device may be selectively coupled to a fixed voltage, for example, to prevent the unconnected or unused input terminals from floating and/or from causing indeterminate logic states in associated logic circuitry. In addition, or in the alternative, the unconnected or unused input terminals of the device may be selectively looped back to one or more controlled output terminals of the device, for example, to prevent the unconnected or unused input terminals from floating and/or from causing indeterminate logic states. In this manner, aspects of the present disclosure may prevent unconnected input terminals of vertically stacked devices arranged in an active-on-active die assembly from causing indeterminate states in associated logic circuits and/or may reduce the susceptibility of such unconnected input terminals to damage caused by electro-static discharge (ESD).

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example implementations. However, it will be apparent to one skilled in the art that these specific details may not be required to practice the example implementations. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example implementations are not to be construed as limited to specific examples described herein but rather to include within their scope all implementations defined by the appended claims.

Figure 1:
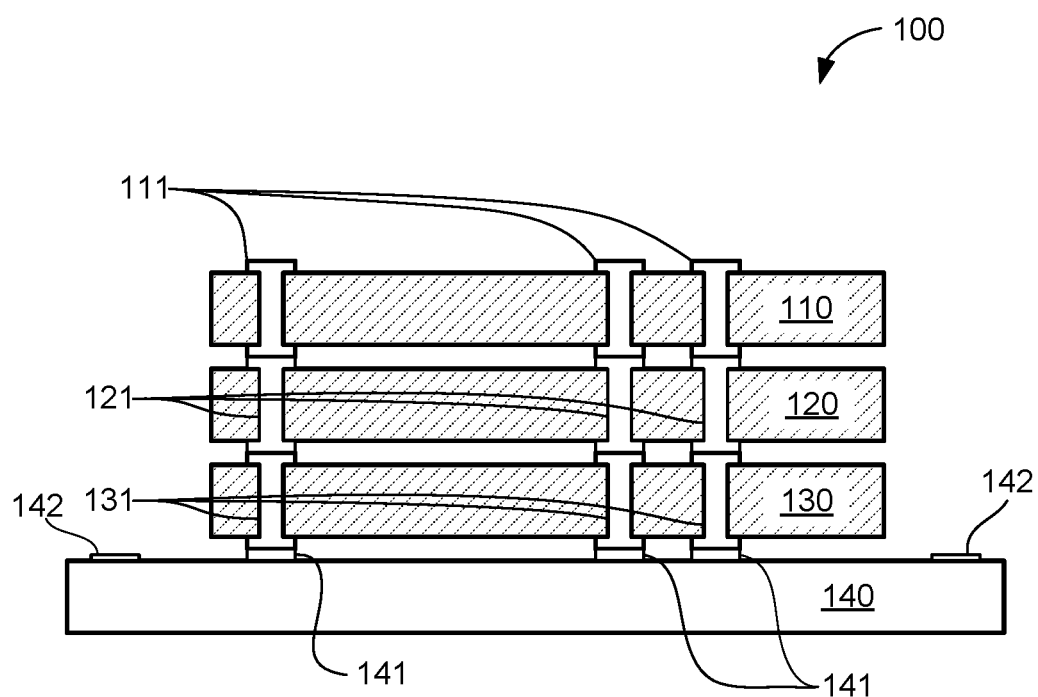
FIG. 1 shows a simplified block diagram of a vertically stacked device assembly.

FIG. 1 shows a simplified block diagram of a vertically stacked device assembly 100. The vertically stacked device assembly 100 may include a first device 110, a second device 120, a third device 130, and a substrate 140. The first device 110, the second device 120, and the third device 130 may be identical devices, similar devices, or entirely different devices. Although shown as including only three devices, in other implementations, the vertically stacked device assembly 100 may include any feasible number of devices. Further, although shown as including only one vertical stack, the vertically stacked device assembly 100 may include any feasible number of vertical stacks.

The first device 110, the second device 120, and the third device 130 may be bonded or attached to each other using through-silicon vias (TSVs) that provide conductive contacts for electrical signals to enter and exit each of the devices 110, 120, and 130. In the example of FIG. 1, the first device 110 includes a number of first TSVs 111, the second device 120 includes a number of second TSVs 121, and the third device 130 includes a number of third TSVs 131. For simplicity, each of the devices 110, 120, and 130 is shown to include three TSVs. In other implementations, each of the devices 110, 120, and 130 may include any feasible number of TSVs.

The first TSVs 111 associated with the first device 110 may be in contact with and form electrical connections with the second TSVs 121 associated with the second device 120, and the second TSVs 121 associated with the second device 120 may be in contact with and form electrical connections with the third TSVs 131 associated with the third device 130. In this manner, the sets of TSVs 111, 121, and 131 may allow signals to be exchanged or routed between the devices 110, 120, and 130 of the vertically stacked device assembly 100.

The substrate 140, which may be formed from silicon, fiberglass, or any other feasible material, may be bonded to the third device 130 and may include a number of pads 141 and a number of bond pads 142. The pads 141 may be in contact with and form electrical connections with corresponding TSVs 131 associated with the third device 130, for example, to provide TSV-to-TSV signal routing through the pads 141. The bond pads 142 may be electrically coupled to the pads 141 and the TSVs, for example, so that signals input to or output from any of the devices 110, 120, and 130 of the vertically stacked device assembly 100 can be accessed via the bond pads 142.

Figure 2:
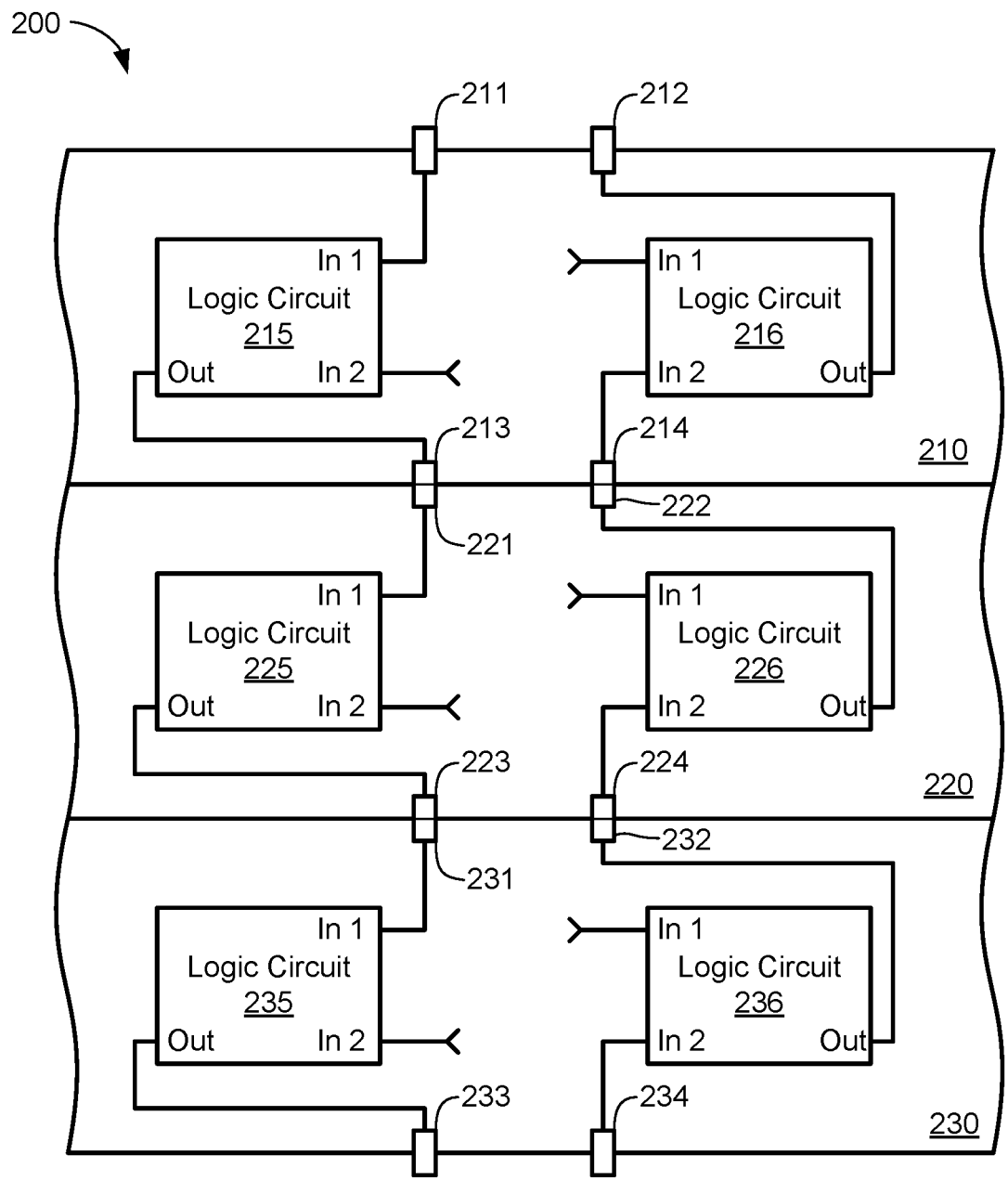
FIG. 2 shows a partial block diagram of a stacked active-on-active die assembly according to some implementations.

FIG. 2 shows a partial block diagram of a stacked active-on-active die assembly 200 according to some implementations. The stacked active-on-active die assembly 200 may include a first device 210, a second device 220, and a third device 230. The first device 210, the second device 220, and the third device 230, which may be implementations of the first device 110, the second device 120, and the third device 130 of FIG. 1, may be bonded together and electrically coupled to each other using TSVs. For the example of FIG. 2, the first device 210 is shown to include four TSVs 211-214 and two logic circuits 215-216, the second device 220 is shown to include four TSVs 221-224 and two logic circuits 225-226, and the third device 230 is shown to include four TSVs 231-234 and two logic circuits 235-236. In some implementations, each of the devices 210, 220, and 230 may be a programmable logic device (PLD), and each of the logic circuits 215-216, 225-226, 235-236 may include one or more of a configurable logic block (CLB), a block random access memory (BRAM), a programmable interconnect element (INT), or any other suitable logic element or circuit.

The TSVs 211-214 of the first device 210 may be disposed such that at least a portion of each of the TSVs 211-214 is located on an outer surface of the first device 210, for example, so that input signals to and output signals from the logic circuits 215-216 of the first device 210 can be accessed by the other devices (or by other external devices). Similarly, the TSVs 221-224 of the second device 220 may be disposed such that at least a portion of each of the TSVs 221-224 is located on an outer surface of the second device 220, and the TSVs 231-234 of the third device 230 may be disposed such that at least a portion of each of the TSVs 231-234 is located on an outer surface of the third device 230.

Although not shown for simplicity, each of the stacked devices 110, 120, and 130 may include programmable logic that can be programmed to perform a multitude of different user-defined functions or operations. In some embodiments, the programmable logic may include an array of programmable circuit blocks or tiles each including programmable interconnect circuitry and programmable logic circuitry. The programmable circuit blocks may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design. In addition, or in the alternative, the programmable logic may include a number of input/output blocks (IOBs). In one or more implementations, the programmable logic may be implemented as an array of programmable fabric sub-regions (FSRs) that can be distributed across the programmable fabric.

The programmable interconnect circuitry may include a plurality of interconnect wires of varying lengths interconnected by programmable interconnect points (PIPs). The interconnect wires may be configured to provide connectivity between components within a particular programmable tile, between components within different programmable tiles, and between components of a programmable tile and other subsystems or devices. The programmable interconnect circuitry and the programmable circuit blocks may be programmed or configured by loading configuration data into configuration registers that define how the programmable elements are configured and operate to implement a corresponding user-specified circuit design. In some aspects, the programmable interconnect circuitry within each of a number of the programmable circuit blocks may form part of a programmable interconnect fabric that provides block-level and/or device-level signal routing resources for the corresponding device.

Each of the logic circuits 215-216, 225-226, and 235-236 shown in FIG. 2 may include look-up tables (LUTs), flip-flops, combinational logic, and/or programmable interconnect circuitry that can be collectively programmed by configuration data to perform various logic functions (such as addition and subtraction) on input signals of varying widths. The LUTs may be of any suitable size, and may include any suitable number of inputs and outputs. For implementations in which the logic circuits 215-216, 225-226, and 235-236 include CLBs, each CLB may include 32 LUTs and 64 flip-flops. Each CLB may also include arithmetic carry logic and multiplexers that can be used to implement wider logic functions. The logic circuits 215-216, 225-226, and 235-236 may be programmed to implement one or more user-defined logic functions by loading configuration data into a number of configuration registers (not shown for simplicity). For simplicity, each of the logic circuits 215-216, 225-226, and 235-236 of FIG. 2 is shown to include two input terminals and one output terminal. In some aspects, the logic circuits 215-216, 225-226, and 235-236 may include any suitable number of input terminals and output terminals.

Referring to the first device 210, a first input terminal of logic circuit 215 is coupled to the TSV 211, and a second input terminal of logic circuit 215 may be coupled to any other device, terminal, or circuit in the first device 210 (specific signal connections not shown for simplicity). The output terminal of logic circuit 215 may be coupled to the TSV 213, for example, to exchange signals with the second device 220. A first input terminal of logic circuit 216 may be coupled to any other device, terminal, or circuit in the first device 210 (specific signal connections not shown for simplicity), and a second input terminal of logic circuit 216 may be coupled to the TSV 214, for example, to exchange signals with the second device 220. An output terminal of logic circuit 216 may be coupled to the TSV 212, for example, to exchange signals with one or more external devices (not shown for simplicity).

Referring to the second device 220, a first input terminal of logic circuit 225 is coupled to the TSV 221, for example, to exchange signals with the first device 210. A second input terminal of logic circuit 225 may be coupled to any other device, terminal, or circuit in the second device 220 (specific signal connections not shown for simplicity). The output terminal of logic circuit 225 may be coupled to the TSV 223, for example, to exchange signals with the third device 230. A first input terminal of logic circuit 226 may be coupled to any other device, terminal, or circuit in the second device 220 (specific signal connections not shown for simplicity), and a second input terminal of logic circuit 226 may be coupled to the TSV 224, for example, to exchange signals with the third device 230. An output terminal of logic circuit 226 may be coupled to the TSV 222, for example, to exchange signals with the first device 210.

Referring to the third device 230, a first input terminal of logic circuit 235 is coupled to the TSV 231, for example, to exchange signals with the second device 220. A second input terminal of logic circuit 235 may be coupled to any other device, terminal, or circuit in the third device 230 (specific signal connections not shown for simplicity). The output terminal of logic circuit 235 may be coupled to the TSV 233, for example, to exchange signals with one or more external devices (not shown for simplicity). A first input terminal of logic circuit 236 may be coupled to any other device, terminal, or circuit in the third device 230 (specific signal connections not shown for simplicity), and a second input terminal of logic circuit 236 may be coupled to the TSV 234, for example, to exchange signals with one or more external devices (not shown for simplicity). An output terminal of logic circuit 236 may be coupled to the TSV 232, for example, to exchange signals with the second device 220.

A first pair of TSVs 213 and 221 are connected together to provide signal routing between the output terminal of logic circuit 215 of the first device 210 and the first input terminal of logic circuit 225 of the second device 220, and a second pair of TSVs 214 and 222 are connected together to provide signal routing between the output terminal of logic circuit 226 of the second device 220 and the second input terminal of logic circuit 216 of the first device 210. In this manner, an output signal generated by logic circuit 215 of the first device 210 may be routed as an input signal to logic circuit 225 of the second device 220 through the TSVs 213 and 221, and an output signal generated by logic circuit 226 of the second device 220 may be routed as an input signal to logic circuit 216 of the first device 210 through the TSVs 214 and 222.

A third pair of TSVs 223 and 231 are connected together to provide signal routing between the output terminal of logic circuit 225 of the second device 220 and the first input terminal of logic circuit 235 of the third device 230, and a fourth pair of TSVs 224 and 232 are connected together to provide signal routing between the output terminal of logic circuit 236 of the third device 230 and the second input terminal of logic circuit 226 of the second device 220. In this manner, an output signal generated by the logic circuit 225 of the second device 220 may be routed as an input signal to the logic circuit 235 of the third device 230 through the TSVs 223 and 231, and an output signal generated by the logic circuit 236 of the third device 230 may be routed as an input signal to the logic circuit 226 of the second device 220 through the TSVs 224 and 232.

In some instances, the designs of the first device 210, the second device 220, and the third device 230 may be identical or substantially similar to each other. For example, a common device design may be implemented by each of the devices 210, 220, and 230 in the vertically stacked device assembly 200. An undesirable consequence of such a common device design is that one or more I/O terminals of the outermost devices (such as the first device 210 and the third device 230) of the assembly 200 may be unconnected or "floating." For example, the first device 210 may include an unconnected input terminal associated with the TSV 211, and may include an unconnected output terminal associated with the TSV 212. Similarly, the third device 230 may include an unconnected input terminal associated with the TSV 234, and may include an unconnected output terminal associated with the TSV 233.

As discussed, an unconnected or floating input terminal of a logic circuit may cause indeterminate logic states in logical circuits coupled to the unconnected or floating input terminal. These unconnected input terminals may also be unreachable during testing of the stacked active-on-active die assembly 200, and may increase susceptibility of the stacked active-on-active die assembly 200 to ESD. In one example, the logical circuits that are connected to a floating terminal may be unreachable (undetectable) during a scan processes to test functionality of a respective device. Thus, the unreachable terminal may result in an unknown input voltage for a logic circuit, or may be associated with an output terminal that may not be scannable. In another example, unconnected logic circuit input terminals and logic circuit output terminals may provide an electrical pathway that is susceptible to damage from ESD effects.

Figure 3:
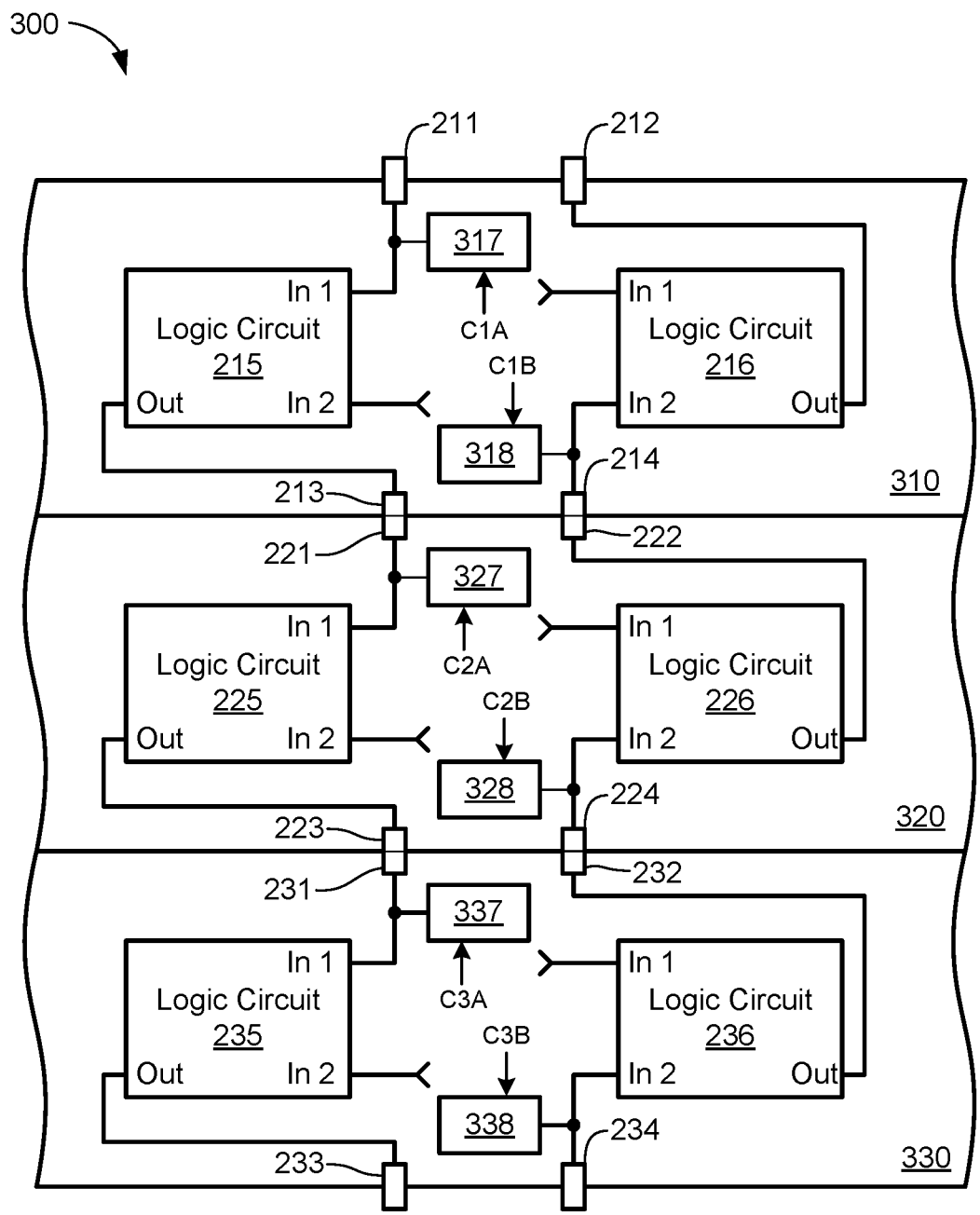
FIG. 3 shows a partial block diagram of a stacked active-on-active die assembly according to other implementations.

FIG. 3 shows a partial block diagram of a stacked active-on-active die assembly 300 according to other implementations. The stacked active-on-active die assembly 300 may include a first device 310, a second device 320, and a third device 330. In some implementations, the first device 310, the second device 320, and the third device 330 may be examples of the first device 210, the second device 220, and the third device 230, respectively, of FIG. 2. For example, the first device 310 may include logic circuits 215-216 and TSVs 211-214, the second device 320 may include logic circuits 225-226 and TSVs 221-224, and the third device 330 may include logic circuits 235-236 and TSVs 231-234. In actual implementations, each of the devices 310, 320, and 330 may include any suitable number of logic circuits and TSVs (and other circuits and components, not shown for simplicity).

Each of the devices 310, 320, and 330 may include one or more termination circuits that can be used to control unconnected or floating input terminals of logic circuits (and/or other circuits and components, not shown for simplicity). In some implementations, the termination circuits may be configured to couple unused or unconnected logic circuit input terminals to a fixed voltage to prevent the unused or unconnected logic circuit input terminals from floating, which in turn may prevent indeterminate logic states resulting from floating logic circuit input terminals. In some implementations, the fixed voltage may be one of a supply voltage or ground potential. In other implementations, the fixed voltage may be any other suitable voltage that can be used to control unconnected or floating input terminals of logic circuits (and/or other circuits or components provided within the devices 310, 320, and 330).

For the example of FIG. 3, the first device 310 includes a first termination circuit 317 coupled to the TSV 211, and includes a second termination circuit 318 coupled to the TSV 214. The first termination circuit 317 may selectively couple the first input terminal of logic circuit 215 (and thus the TSV 211) to a fixed voltage based on a control signal (C1A), and the second termination circuit 318 may selectively couple the second input terminal of logic circuit 216 (and thus the TSV 214) to the fixed voltage based on a control signal (C1B). In some implementations, asserted states of control signals C1A-C1B may enable respective termination circuits 317-318, and de-asserted states of control signals C1A-C1B may disable respective termination circuits 317-318.

The second device 320 includes a first termination circuit 327 coupled to the TSV 221, and includes a second termination circuit 328 coupled to the TSV 224. The first termination circuit 327 may selectively couple the first input terminal of logic circuit 225 (and thus the TSV 221) to the fixed voltage based on a control signal (C2A), and the second termination circuit 328 may selectively couple the second input terminal of logic circuit 226 (and thus the TSV 224) to the fixed voltage based on a control signal (C2B). In some implementations, asserted states of control signals C2A-C2B may enable respective termination circuits 327-328, and de-asserted states of control signals C2A-C2B may disable respective termination circuits 327-328.

The third device 330 may include a first termination circuit 337 coupled to the TSV 231, and may include a second termination circuit 338 coupled to the TSV 234. The first termination circuit 337 may selectively couple the first input terminal of logic circuit 235 (and thus the TSV 231) to the fixed voltage based on a control signal (C3A), and the second termination circuit 338 may selectively couple the second input terminal of logic circuit 236 (and thus the TSV 234) to the fixed voltage based on a control signal (C3B). In some implementations, asserted states of control signals C3A-C3B may enable respective termination circuits 337-338, and de-asserted states of control signals C3A-C3B may disable respective termination circuits 337-338.

In one or more implementations, the first termination circuit 317 of the first device 310 may be enabled so that the unused or unconnected input terminals associated with the TSV 211 (such as the first input terminal of logic circuit 215) are coupled to the fixed voltage, and the second termination circuit 318 of the first device 310 may be disabled so that the used or connected input terminals associated with the TSV 214 (such as the second input terminal of logic circuit 216) are isolated from the fixed voltage. More specifically, the enabled first termination circuit 317 may couple the first input terminal of logic circuit 215 to the fixed voltage and thereby prevent the first input terminal from floating, and the disabled second termination circuit 318 may isolate the second input terminal of logic circuit 216 from the fixed voltage and thereby allow signals to be routed from the output terminal of logic circuit 226 to the second input terminal of logic circuit 216. Thus, unused or unconnected input terminals that may previously have been in an indeterminate state may be driven to a determined state by a respective termination circuit. In this manner, scan testing coverage may be increased by allowing floating input terminals to be programmed to a known logic state (e.g., to the fixed voltage).

For the second device 320, the first termination circuit 327 may be disabled to isolate the first input terminal of logic circuit 225 from the fixed voltage, and the second termination circuit 328 may be disabled to isolate the second input terminal of logic circuit 226 from the fixed voltage. More specifically, the disabled state of the first termination circuit 327 may allow signals to be routed from the output terminal of logic circuit 215 to the first input terminal of logic circuit 225, and the disabled state of the second termination circuit 328 may allow signals to be routed from the output terminal of logic circuit 236 to the second input terminal of logic circuit 226.

For the third device 330, the first termination circuit 337 may be disabled to isolate the first input terminal of logic circuit 235 from the fixed voltage, and the second termination circuit 338 may be enabled to couple the second input terminal of logic circuit 236 to the fixed voltage. More specifically, the disabled state of the first termination circuit 337 may allow signals to be routed from the output terminal of logic circuit 225 to the first input terminal of logic circuit 235, and the enabled state of the second termination circuit 338 may prevent the second input terminal of logic circuit 236 from floating. Thus, as described above with respect to the first device 310, testing of the device 330 may be improved by controlling previously unused or unconnected input terminals. In addition, the termination circuits 317-318, 327-328, and 337-338 may be configured to selectively route test signals between each of the devices 310, 320, and 330 of the stacked active-on-active die assembly 300, thereby allowing previously unreachable floating terminals to be included in testing operations (such as boundary scan testing).

The termination circuits 317-318, 327-328, and 337-338 may be disabled (in response to the control signals) in any suitable manner. For example, in some aspects, the termination circuits 317-318, 327-328, and 337-338 may be disabled by tri-stating their input terminals, by operating the termination circuits in a high impedance mode, by isolating the termination circuits from their associated TSVs, or any combination thereof. In other aspects, the termination circuits 317-318, 327-328, and 337-338 may be disabled using other suitable techniques or mechanisms.

The termination circuits 317-318, 327-328, and 337-338 may be programmed or configured using configuration data loaded into corresponding configuration registers (not shown for simplicity), may be controlled or configured by one or more processors (not shown for simplicity), or both. In this manner, configuration data may determine whether each of the termination circuits 317-318, 327-328, and 337-338 is to be enabled or disabled during operation of the stacked active-on-active die assembly 300, for example, by controlling the logic states (such as asserted or de-asserted) of respective pairs of control signals C1A-C1B, C2A-C2B, and C3A-C3B. In addition, or in the alternative, the termination circuits 317-318, 327-328, and 337-338 may include ESD protection circuitry, for example, to protect the stacked active-on-active die assembly 300 from damage associated with ESD events.

The termination circuits 317-318, 327-328, and 337-338 may be used with any stacked active-on-active die assembly, and each of the dice may be antenna suitable die, device, or component. In some implementations, the termination circuits 317-318, 327-328, and 337-338 may be used with programmable logic devices (PLDs) such as, for example, field programmable gate arrays (FPGAs). In some aspects, the termination circuits 317-318, 327-328, and 337-338 may be used with modules, sub-modules, circuit blocks, integrated circuits, or the like.

Figure 4A:
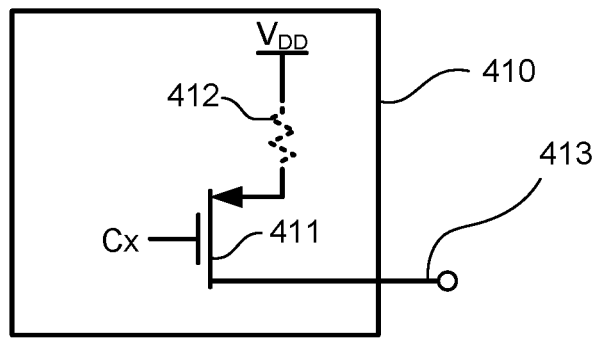
FIG. 4A shows an example termination circuit according to some implementations.

FIG. 4A shows an example termination circuit 410 according to some implementations. The termination circuit 410 includes a transistor 411 and an optional resistor 412 (shown in dotted lines), and may selectively couple a terminal 413 to a supply voltage VDD based on a control signal Cx. The terminal 413 may be (or may correspond to) one of the logic circuit input terminals of FIG. 3, and the supply voltage VDD may be one example of the fixed voltage. The resistor 412 may have any suitable resistance value, and the fixed voltage may be of any suitable value. The transistor 411 is coupled between terminal 413 and VDD, and includes a gate to receive control signal Cx. When control signal Cx is asserted, transistor 411 turns on and couples terminal 413 to VDD, for example, to prevent terminal 413 from floating. Conversely, when control signal Cx is de-asserted, transistor 411 turns off and isolates terminal 413 from VDD.

The transistor 411 may be any suitable transistor including, for example, a PMOS transistor, an NMOS transistor, a T-gate transistor, or a MOSFET. Thus, the depiction of transistor 411 in FIG. 4A as a PMOS transistor is merely illustrative. In some implementations, the termination circuit 410 may be configured to source or sink relatively small currents (such as a few microamps) sufficient to drive a voltage within an associated device while occupying a minimum amount of circuit area.

Figure 4B:
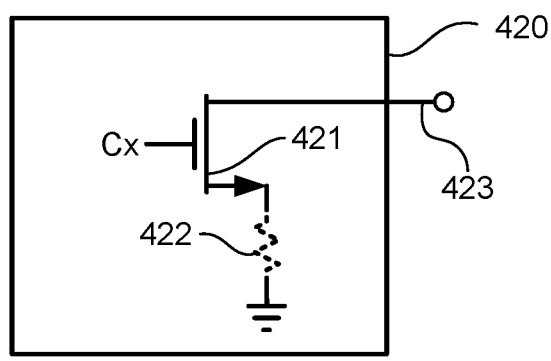
FIG. 4B shows another example termination circuit according to some implementations.

FIG. 4B shows another example termination circuit 420 according to some implementations. The termination circuit 420 includes a transistor 421 and an optional resistor 422 (shown in dotted lines), and may selectively couple a terminal 423 to ground potential based on control signal Cx. The terminal 423 may be (or may correspond to) one of the logic circuit input terminals of FIG. 3, and the resistor 422 may have any suitable resistance value. The transistor 421 is coupled between terminal 423 and ground potential, and includes a gate to receive control signal Cx. When control signal Cx is asserted, transistor 421 turns on and couples terminal 423 to ground potential, for example, to prevent terminal 423 from floating. Conversely, when control signal Cx is de-asserted, transistor 421 turns off and isolates terminal 423 from ground potential.

The transistor 421 may be any suitable transistor including, for example, a PMOS transistor, an NMOS transistor, a T-gate transistor, or a MOSFET. Thus, the depiction of transistor 421 in FIG. 4B as an NMOS transistor is merely illustrative. In some implementations, the termination circuit 420 may be configured to source or sink relatively small currents (such as a few microamps) sufficient to drive a voltage within an associated device while occupying a minimum amount of circuit area.

In some implementations, the termination circuits 410 and 420 may be implemented with tristate buffers (not shown for simplicity). Thus, a tristate buffer may replace either transistor 411 or transistor 421 in the respective termination circuit. The tristate buffers may be similarly controlled by control signal Cx. Furthermore, the transistor 411 and the transistor 412 may mitigate ESD damage by providing a current path through a diffusion layer of a transistor via terminal 413 or terminal 423, respectively.

The control signals Cx provided to termination circuits 410 and/or termination circuits 420 may be generated by any suitable circuit, device, or component within or associated with any suitable vertically stacked device assembly (such as the stacked active-on-active die assembly 200 of FIG. 2 or the stacked active-on-active die assembly 300 of FIG. 3). In some implementations, control signals Cx may be generated by a processor. In addition, or in the alternative, control signals Cx may be determined by configuration data.

Figure 5:
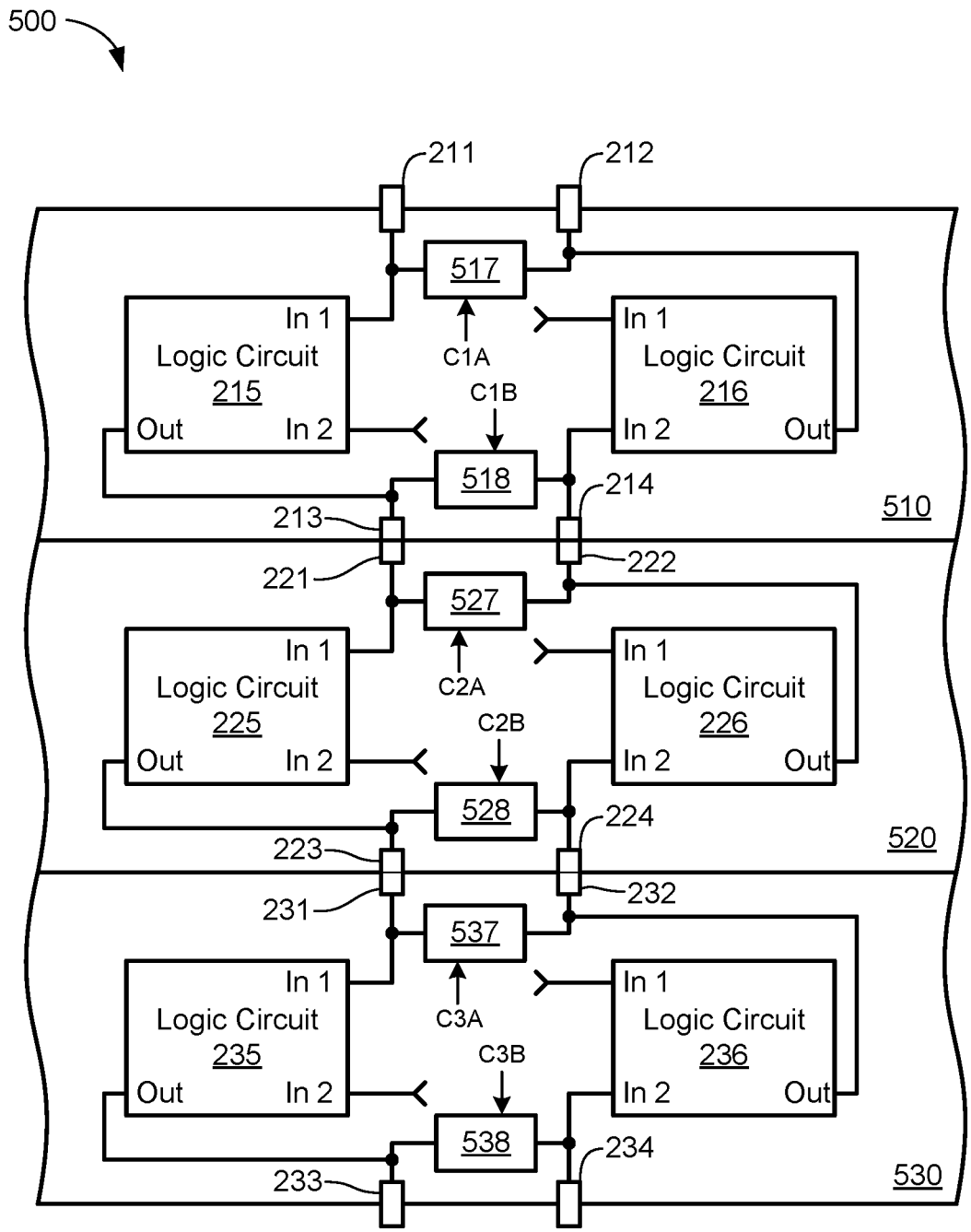
FIG. 5 shows a partial block diagram of a stacked active-on-active die assembly according to some other implementations.

FIG. 5 shows a partial block diagram of a stacked active-on-active die assembly 500 according to some other implementations. The stacked active-on-active die assembly 500 may include a first device 510, a second device 520, and a third device 530. In some implementations, the first device 510, the second device 520, and the third device 530 may be examples of the first device 210, the second device 220, and the third device 230, respectively, of FIG. 2. In other implementations, the first device 510, the second device 520, and the third device 530 may be examples of the first device 310, the second device 320, and the third device 330, respectively, of FIG. 3. For example, the first device 510 may include logic circuits 215-216 and TSVs 211-214, the second device 520 may include logic circuits 225-226 and TSVs 221-224, and the third device 530 may include logic circuits 235-236 and TSVs 231-234. In actual implementations, each of the devices 510, 520, and 530 may include any suitable number of logic circuits and TSVs (and other circuits and components, not shown for simplicity).

Each of the devices 510, 520, and 530 may include one or more loopback circuits that can selectively couple unconnected or floating logic circuit input terminals to a logic circuit output terminal. For example, the first device 510 may include a first loopback circuit 517 coupled to TSVs 211-212, and may include a second loopback circuit 518 coupled to TSVs 213-214. The first loopback circuit 517 may be configured to selectively couple an input terminal of the first logic circuit 215 to an output terminal of the second logic circuit 216 based on a control signal (CIA), and the second loopback circuit 518 may be configured to selectively couple an input terminal of the second logic circuit 216 to an output terminal of the first logic circuit 215 based on a control signal (C1B). In some implementations, asserted states of control signals C1A-C1B may enable respective loopback circuits 517-518, and de-asserted states of control signals C1A-C1B may disable respective loopback circuits 517-518.

The second device 520 may include a first loopback circuit 527 coupled to TSVs 221-222, and may include a second loopback circuit 528 coupled to TSV 223-224. The first loopback circuit 527 may be configured to selectively couple an input terminal of the first logic circuit 225 to an output terminal of the second logic circuit 226 based on control signal C2A, and the second loopback circuit 528 may be configured to selectively couple an input terminal of the second logic circuit 226 to an output terminal of the first logic circuit 225 based on control signal C2B. In some implementations, asserted states of control signals C2A-C2B may enable respective loopback circuits 527-528, and de-asserted states of control signals C2A-C2B may disable respective loopback circuits 527-528.

The third device 530 may include a first loopback circuit 537 coupled to TSVs 231-232, and may include a second loopback circuit 538 coupled to TSVs 233-234. The first loopback circuit 537 may be configured to couple an input terminal of the first logic circuit 235 to an output terminal of the second logic circuit 236 based on control signal C3A, and the second loopback circuit 538 may be configured to couple an input terminal of the second logic circuit 236 to an output terminal of the first logic circuit 235 based on control signal C3B. In some implementations, asserted states of control signals C3A-C3B may enable respective loopback circuits 537-538, and de-asserted states of control signals C3A-C3B may disable respective loopback circuits 537-538.

For the first device 510, the first loopback circuit 517 may be enabled to couple the unused input terminal of logic circuit 215 to the output terminal of the second logic circuit 216, and the second loopback circuit 518 may be disabled to avoid interfering with signal exchanges between the first device 510 and the second device 520. More specifically, because the first input terminal of logic circuit 215 is unused, the first loopback circuit 517 may be enabled to prevent the first input terminal of logic circuit 215 from floating. The second input terminal of logic circuit 216 is connected to at least logic circuit 226 in the second device 520, and therefore the second loopback circuit 518 may be disabled (such as because the second input terminal of logic circuit 216 may not float).

For the second device 520, the first loopback circuit 527 may be disabled to avoid interfering with signal exchanges between the first device 510 and the second device 520, and the second loopback circuit 528 may be disabled to avoid interfering with signal exchanges between the second device 520 and the third device 530. More specifically, because the first input terminal of logic circuit 225 is connected to at least logic circuit 215 in the first device 510 (and is therefore not unconnected or floating), the first loopback circuit 528 may be disabled. Similarly, because the second input terminal of logic circuit 226 is connected to at least logic circuit 236 in the third device 530 (and is therefore not unconnected or floating), the second loopback circuit 528 may be disabled.

For the third device 530, the first loopback circuit 537 may be disabled to avoid interfering with signal exchanges between the second device 520 and the third device 530, and the second loopback circuit 538 may be enabled to couple the unused input terminal of logic circuit 236 to the output terminal of logic circuit 235. More specifically, because the first input terminal of logic circuit 235 is connected to at least logic circuit 225 in the second device 520 (and is therefore not unconnected or floating), the first loopback circuit 537 may be disabled. The second input terminal of logic circuit 236 is unused, and therefore the second loopback circuit 538 may be enabled to prevent the second input terminal of logic circuit 236 from floating.

The loopback circuits 517-518, 527-528, and 537-538 may be programmed or configured using configuration data loaded into corresponding configuration registers (not shown for simplicity). In addition, or in the alternative, the loopback circuits 517-518, 527-528, and 537-538 may be controlled and/or configured by one or more processors provided within each of the respective devices 510, 520, and 530. Thus, in some aspects, the configuration data may determine whether each of the loopback circuits 517-518, 527-528, and 537-538 is to couple one or more corresponding logic circuit input terminals to a logic circuit output terminal, or is to be disabled. Therefore, instead of coupling an unused input terminal to a fixed voltage as described with respect to FIG. 3, aspects of the present disclosure may avoid uncontrolled input terminals and/or indeterminate logic states by coupling unused or unconnected logic circuit input terminals to the output terminal of another logic circuit. In some implementations, testability of a device may be increased by the loopback circuits 517-518, 527-528, and 537-538 discussed above. For example, an unused output terminal of a logic circuit may be looped back to an unused input terminal of another logic circuit, thereby allowing a previously unreachable (unscannable) output node to be monitored. Furthermore, in some implementations, the loopback circuits 517-518, 527-528, and 537-538 may provide additional routing capabilities for a respective device. For example, loopback circuit 517 may provide a programmable interconnect point (PIP) between first logic circuit 215 and second logic circuit 216. In one or more implementations, the loopback circuits 517-518, 527-528, and 537-538 may also include ESD protection circuitry, for example, to protect the assembly 500 from damage caused by ESD events. The loopback circuits 517-518, 527-528, and 537-538 may be used with any stacked devices. In some implementations, the loopback circuits 517-518, 527-528, and 537-538 may be used with modules, sub-modules, circuit blocks, integrated circuits, or the like.

Figure 6A:
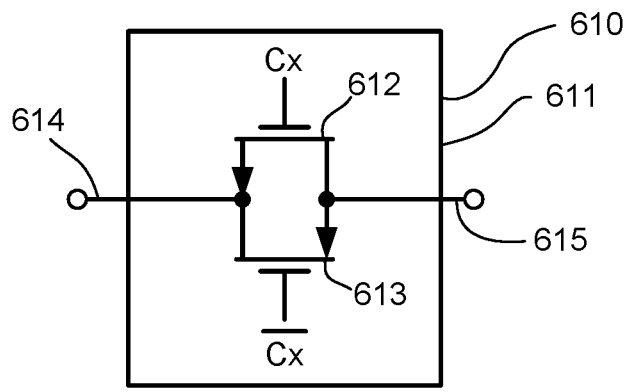
FIG. 6A shows an example loopback circuit according to some implementations.

FIG. 6A shows an example loopback circuit 610 according to some implementations. The loopback circuit 610, which includes a T-gate 611 formed by an N-channel MOSFET 612 and a P-channel MOSFET 613, may be configured to selectively couple a first terminal 614 to a second terminal 615 based on control signal Cx. More specifically, control signal Cx is provided to the gate of transistor 612, and its inverse Cx is provided to the gate of transistor 613. When control signal Cx is asserted, the T-gate 611 may be or may enter a conductive state to couple the first terminal 614 to the second terminal 615, thereby preventing the first terminal 614 from floating. Conversely, when control signal Cx is de-asserted, the T-gate 611 may be or may enter a non-conductive state to isolate the first terminal 614 from the second terminal 615.

Figure 6B:
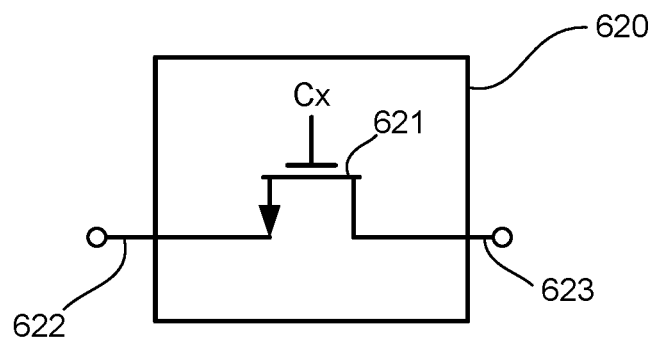
FIG. 6B shows another example loopback circuit according to some implementations.

FIG. 6B shows another example loopback circuit 620, in accordance with some implementations. The loopback circuit 620, which includes an N-channel MOSFET 621 coupled between a first terminal 622 and a second terminal 623, may be configured to selectively couple the first terminal 622 and the second terminal 623 together based on control signal Cx. When control signal Cx is asserted, the N-channel MOSFET 621 may be or may enter a conductive state to couple the first terminal 622 to the second terminal 623, thereby preventing the first terminal 622 from floating. Conversely, when control signal Cx is de-asserted, the N-channel MOSFET 621 may be or may enter a non-conductive state to isolate the first terminal 622 from the second terminal 623.

Figure 6C:
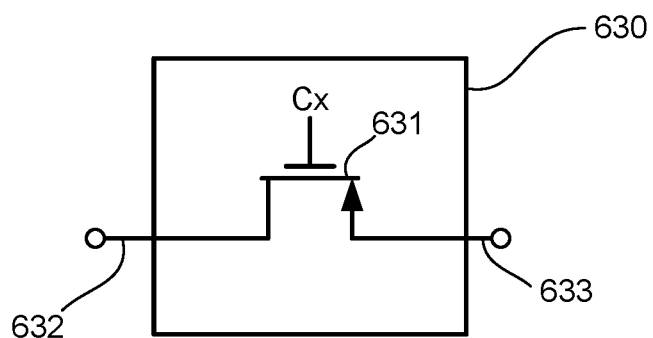
FIG. 6C shows another example loopback circuit according to some implementations.

FIG. 6C shows another example loopback circuit 630, in accordance with some implementations. The loopback circuit 630 is similar to the loopback circuit 620 of FIG. 6B, except that the loopback circuit 630 includes a P-channel MOSFET 631, rather than an N-channel MOSFET 621.

Similar to the transistors associated with the termination circuits of FIG. 4, the transistors 612, 613, 621, and 631 may mitigate ESD damage by providing a current path through a diffusion layer of the respective transistors.

Figure 7:
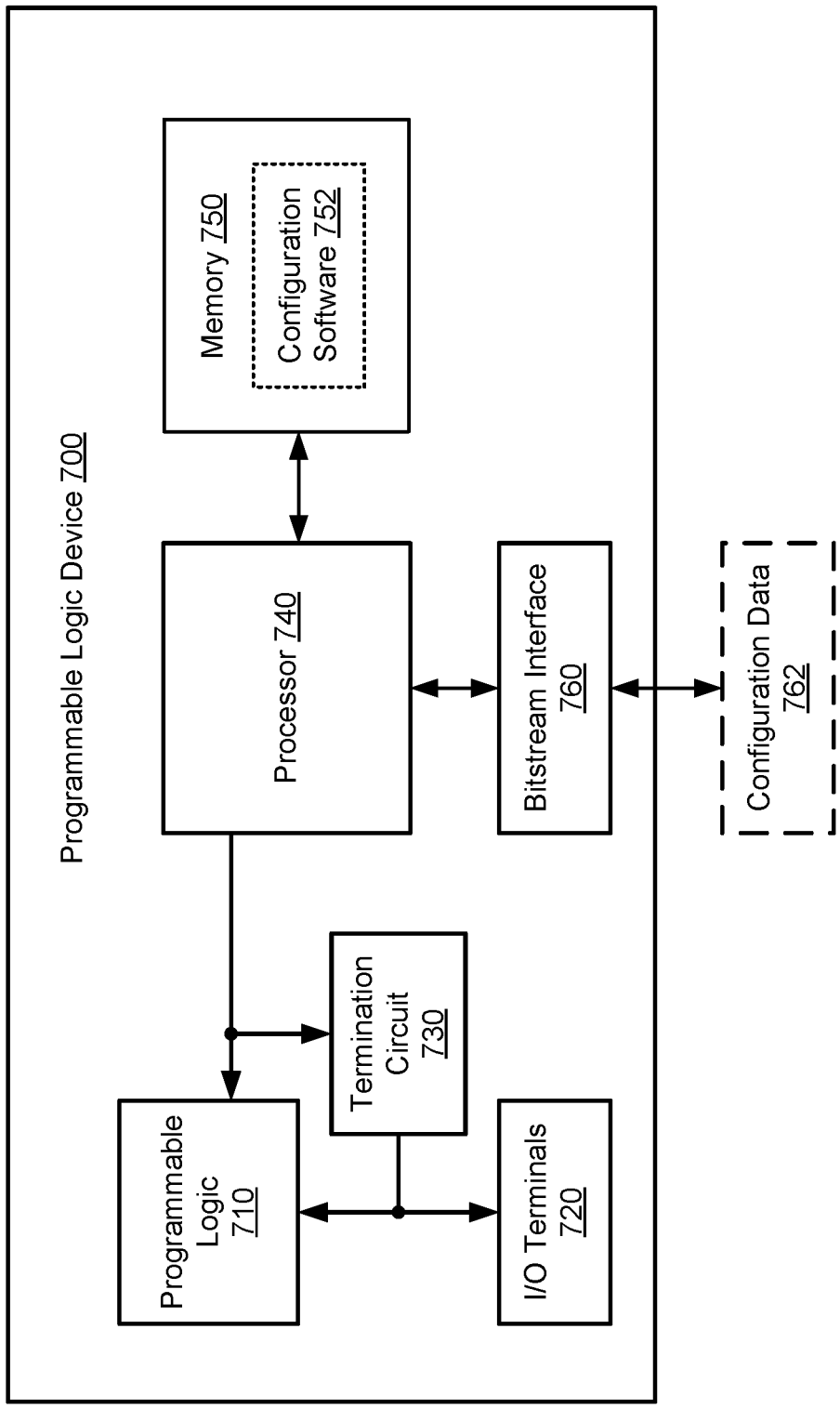
FIG. 7 shows a block diagram of an example programmable logic device.

FIG. 7 shows a block diagram of an example programmable logic device (PLD) 700, in accordance with some implementations. The device 700 may be an implementation of the devices 310, 320, and 330 of FIG. 3, the devices 510, 520, and 530 of FIG. 5, or both. The device 700 may include a programmable logic block 710, input/output (I/O) terminals 720, a termination circuit 730, a processor 740, a memory 750, and a bitstream interface 760. In some implementations, the device 700 may include additional components, devices, functional units, and other suitable components not shown for simplicity.

The programmable logic block 710 may be programmed or configured to perform a multitude of different user-defined functions or operations. In some embodiments, the programmable logic block 710 may include an array of logic circuits (such as programmable logic elements (PLEs) or tiles) each including programmable interconnect circuitry and programmable logic circuitry. The logic circuits may include (but are not limited to) configurable logic blocks (CLBs), random access memory blocks (BRAM), digital signal processing blocks (DSPs), clock managers, delay lock loops (DLLs), and/or other logic or circuits that can be programmed or configured to implement a user-specified circuit design. In addition, or in the alternative, the programmable logic block 710 may include a number of input/output blocks (IOBs). In one or more embodiments, the programmable logic block 710 may be implemented as an array of programmable fabric sub-regions (FSRs) that can be distributed across the device 700.

The I/O terminals 720, which may be coupled to the programmable logic block 710, may include connectors, contacts, pads, vias, TSVs, and the like. In some implementations, the I/O terminals 720 may be disposed on an outer surface of the device 700, for example, such that signals may be provided to or received by the programmable logic block 710 through the I/O terminals 720. The termination circuit 730 may be used to terminate signals or to loopback signals to and from the programmable logic block 710. In some implementations, the termination circuit 730 may include one or more instances of the termination circuit 410 of FIG. 4A, one or more instances of the termination circuit 420 of FIG. 4B, one or more instances of the loopback circuit 610 of FIG. 6A, one or more instances of the loopback circuit 620 of FIG. 6B, and/or one or more instances of the loopback circuit 630 of FIG. 6C.

The bitstream interface 760 may include an input port for receiving a bitstream that includes configuration data 762. In some implementations, the processor 740 may configure at least the programmable logic block 710 and the termination circuit 730 based on the configuration data 762.

The memory 750 may include a non-transitory computer-readable storage medium (e.g., one or more nonvolatile memory elements, such as EPROM, EEPROM, Flash memory, a hard drive, etc.) that may store a configuration software circuit 752. The configuration software module 752 may include instructions that, when executed by the processor 740, cause the device 700 to perform the corresponding functions.

The processor 740 may be any one or more suitable processors capable of executing scripts or instructions of one or more software programs stored in the programmable logic device 700 (e.g., within the memory 750). The processor 740 may execute the configuration software module 752 to receive the configuration data 762 and configure one or more portions of the programmable logic device 700 accordingly. For example, the configuration data 762 may include data to configure operations of the programmable logic block 710 and the termination circuit 730.

Figure 8:
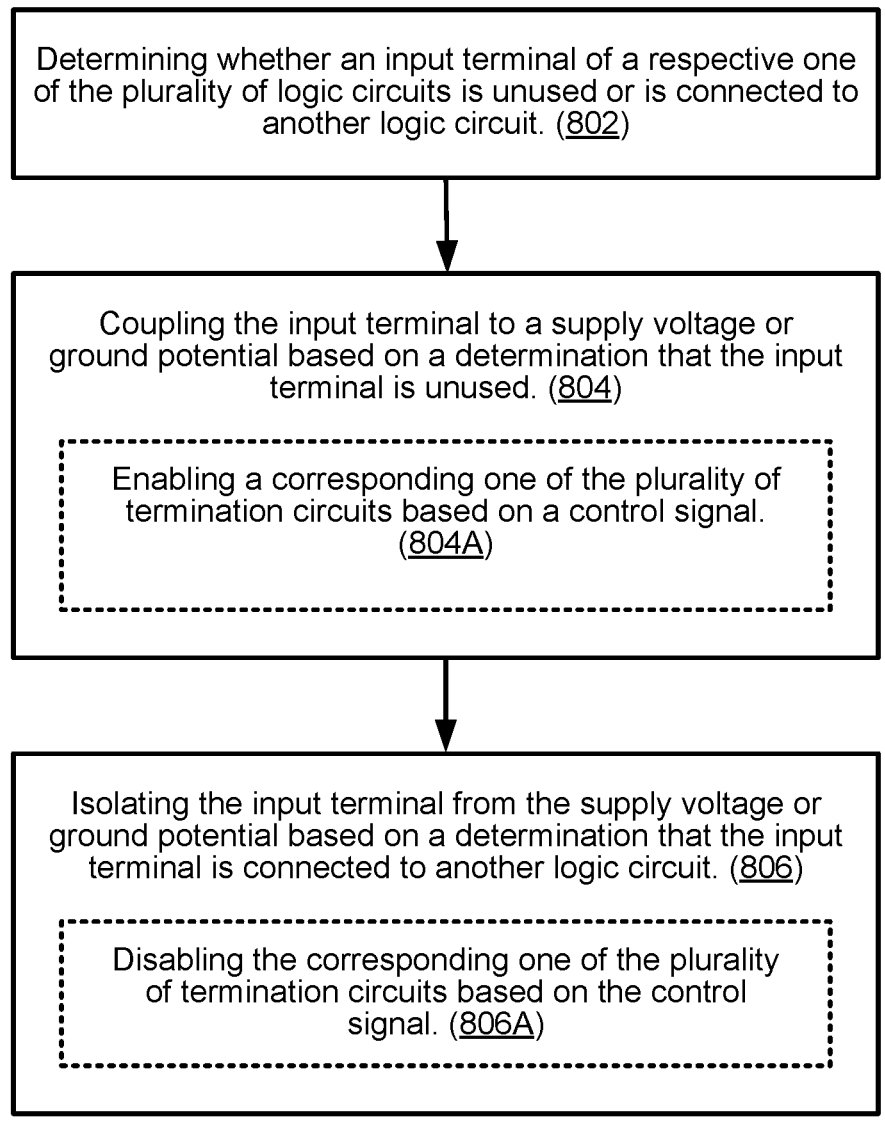
FIG. 8 shows an illustrative flow chart depicting an example operation for configuring a device according to some implementations.

FIG. 8 shows an illustrative flow chart depicting an example operation 800 for configuring a device according to some implementations. The example operation 800 is described below with respect to the stacked active-on-active die assembly 200 of FIG. 2, the stacked active-on-active die assembly 300 of FIG. 3, and the stacked active-on-active die assembly 500 of FIG. 5 for illustrative purposes only. It is to be understood that the example operation 800 may be performed by other suitable vertically stacked die assemblies and/or other suitable devices.

The operation 800 may begin at block 802 by determining whether an input terminal of a respective one of the plurality of logic circuits is unused or is connected to another logic circuit. In some implementations, the determination may be based on (or derived from) configuration data associated with the device. For example, referring also to FIG. 3, the first input terminal of logic circuit 215 of the first device 310 is not connected to another circuit or device, and is therefore unused. Conversely, the second input terminal of logic circuit 216 of the first device is connected to logic circuit 226 of the second device 320.

The operation 800 may proceed at block 804 by coupling the input terminal to a supply voltage or ground potential based on a determination that the input terminal is unused. In some implementations, the input terminal may be coupled to the supply voltage or ground potential by enabling a corresponding one of the plurality of termination circuits based on a control signal (804A). For example, referring also to FIG. 3, an asserted control signal C1A may enable the termination circuit 317 to couple the first input terminal of logic circuit 215 to the supply voltage or ground potential.

The operation 800 may proceed at block 806 by isolating the input terminal from the supply voltage or ground potential based on a determination that the input terminal is connected to another logic circuit. In some implementations, the input terminal may be isolated from the supply voltage or ground potential by disabling the corresponding one of the plurality of termination circuits based on the control signal (806A). For example, referring also to FIG. 3, a de-asserted control signal C1 B may disable the termination circuit 318 and isolate the second input terminal of logic circuit 216 from the supply voltage or ground potential.

Figure 9:
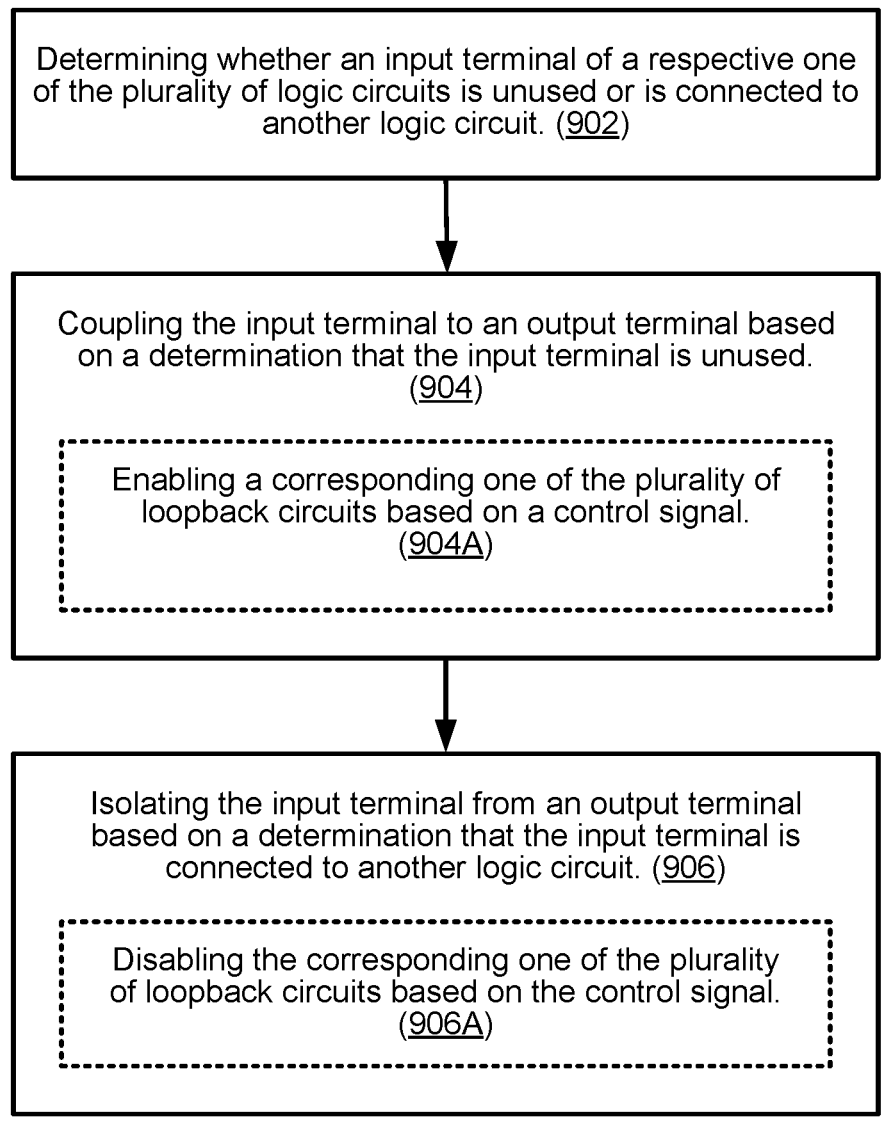
FIG. 9 shows an illustrative flow chart depicting another example operation for configuring a device according to some implementations.

FIG. 9 shows an illustrative flow chart depicting another example operation 900 for configuring a device according to some implementations. The example operation 900 is described below with respect to the stacked active-on-active die assembly 200 of FIG. 2, the stacked active-on-active die assembly 300 of FIG. 3, and the stacked active-on-active die assembly 500 of FIG. 5 for illustrative purposes only. It is to be understood that the example operation 900 may be performed by other suitable vertically stacked die assemblies and/or other suitable devices.

The operation 900 may begin at block 902 by determining whether an input terminal of a respective one of the plurality of logic circuits is unused or is connected to another logic circuit. In some implementations, the determination may be based on (or derived from) configuration data associated with the device. For example, referring also to FIG. 5, the first input terminal of logic circuit 215 of the first device 310 is not connected to another circuit or device, and is therefore unused. Conversely, the second input terminal of logic circuit 216 of the first device 310 is connected to logic circuit 226 of the second device 320.

The operation 900 may proceed at block 904 by coupling the input terminal to an output terminal based on a determination that the input terminal is unused. In some implementations, the input terminal may be coupled to an output terminal by enabling a corresponding one of the plurality of loopback circuits based on a control signal (904A). For example, referring also to FIG. 5, an asserted control signal C1A may enable the loopback circuit 517 to couple the first input terminal of logic circuit 215 to the first output terminal of logic circuit 216.

The operation 900 may proceed at block 906 by isolating the input terminal from an output terminal based on a determination that the input terminal is connected to another logic circuit. In some implementations, the input terminal may be isolated from the output terminal by disabling the corresponding one of the plurality of loopback circuits based on the control signal (906A). For example, referring also to FIG. 3, a de-asserted control signal C1 B may disable the loopback circuit 518 and isolate the second input terminal of logic circuit 216 from the output terminal of logic circuit 215.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example implementations have been described with reference to specific example implementations thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. A field programmable gate array (FPGA), comprising:
 a plurality of logic circuits each including one or more input terminals and an output terminal;
 a memory storing configuration data indicative of one or more control signals; and
 one or more termination circuits each associated with a respective one of the input terminals and configured to:
  receive a respective one of the control signals, the control signal indicating that the associated input terminal is floating; and
  drive the associated input terminal to a known logic state based on the received control signal.

2. The FPGA of claim 1, wherein the FPGA includes a programmable logic device (PLD), and each of the logic circuits comprises one of a configurable logic block (CLB), a block random access memory (BRAM), or a programmable interconnect element (INT).

3. The FPGA of claim 1, wherein each termination circuit is configured to couple the corresponding floating logic circuit input terminal to a voltage or ground potential.

4. The FPGA of claim 1, wherein each termination circuit is configured to couple the corresponding floating logic circuit input terminal to an output terminal of another logic circuit.

5. The FPGA of claim 1, wherein each of the termination circuits comprises one or more of a transmission gate, an N-channel MOSFET, a P-channel MOSFET, or a tri-state buffer.

6. The FPGA of claim 1, wherein the FPGA comprises a first die of a plurality of dice arranged in an active-on-active die assembly.

7. The FPGA of claim 6, wherein the first die is one of a top die or a bottom die of the plurality of dice arranged in the active-on-active die assembly.

8. The FPGA of claim 6, wherein the one or more termination circuits are configured to route test signals between each die of the plurality of dice arranged in the active-on-active die assembly.

9. A field programmable gate array (FPGA) comprising:
 a memory storing configuration data indicative of one or more control signals;
 a first device including a plurality of first logic circuits, each of the first logic circuits including one or more input terminals and an output terminal; and
 a second device coupled to the first device, and comprising:
  a plurality of second logic circuits, each including one or more input terminals and an output terminal; and
  one or more termination circuits, each associated with a respective one of the input terminals and configured to:
   receive a respective one of the control signals, the control signal indicating that the associated input terminal of the second logic circuit is floating; and
   selectively drive the associated input terminal to a known logic state based on the received control signal.

10. The FPGA of claim 9, wherein the configuration data causes the termination circuits to couple the floating input terminals of each of the second logic circuits to one of a voltage, ground potential, or the output terminal of another one of the second logic circuits.

11. The FPGA of claim 9, wherein the second device is bonded to an outer surface of the first device and electrically coupled to the first device using a plurality of through-silicon vias.

12. The FPGA of claim 9, wherein each of the logic circuits comprises one of a configurable logic block (CLB), a block random access memory (BRAM), or a programmable interconnect element (INT) of a programmable logic device (PLD).

13. The FPGA of claim 9, wherein the one or more termination circuits are configured to route test signals between each of the first device, the second device, and one or more other devices stacked in the FPGA.

14. A method of configuring a field programmable gate array (FPGA) including a plurality of logic circuits each including one or more input terminals and a plurality of termination circuits associated with a respective one of the input terminals, the method comprising:
 storing, in a memory, configuration data indicative of one or more control signals;
 receiving a respective one of the control signals, the control signal indicating that the associated input terminal is floating;
 driving the associated input terminal to a known logic state based on the received control signal.

15. The method of claim 14, wherein driving the associated input terminal to a known logic state comprises enabling a corresponding one of the plurality of termination circuits based on the one or more control signals.

16. The method of claim 14, wherein the FPGA is disposed within a stacked die assembly comprising one or more other FPGAs.

* * * * *